United States Patent [19]

Gray

[11] 4,241,003
[45] Dec. 23, 1980

[54] THERMOCOUPLES

[75] Inventor: Adrian L. Gray, Johannesburg, South Africa

[73] Assignee: Tempra Therm Limited, Boksburg North, South Africa

[21] Appl. No.: 870,663

[22] Filed: Jan. 19, 1978

[51] Int. Cl.³ .............................................. B28B 13/02
[52] U.S. Cl. .................................. 264/254; 29/527.1; 249/95
[58] Field of Search ....................... 249/94, 95, 96, 97, 249/122, 124, 127, 134, 175, 176, 177; 264/271, 254, 272, 274, 277; 136/232, 234; 29/527.1

[56] References Cited

U.S. PATENT DOCUMENTS

| | | | |
|---|---|---|---|
| 2,242,117 | 5/1941 | English | 264/277 |
| 2,580,668 | 1/1952 | Franz | 249/96 |
| 2,727,120 | 12/1955 | Boggs | 264/272 X |
| 3,086,251 | 4/1963 | Bernat | 264/277 |
| 3,221,089 | 11/1965 | Cotton | 264/277 X |
| 3,277,350 | 10/1966 | Pearce | 264/272 X |
| 3,298,874 | 1/1967 | Davies | 136/232 |
| 3,537,677 | 11/1970 | Cotton | 249/134 X |
| 3,584,106 | 6/1971 | Miller | 264/272 X |
| 3,606,673 | 9/1971 | Overman | 264/272 X |
| 3,816,183 | 6/1974 | Kraus | 136/234 |
| 3,883,109 | 5/1975 | Hahne | 249/134 X |
| 3,998,422 | 12/1976 | Putzer | 249/127 X |

Primary Examiner—John McQuade
Assistant Examiner—John S. Brown
Attorney, Agent, or Firm—Weiser, Stapler & Spivak

[57] ABSTRACT

This invention relates to a mould for use in manufacturing thermocouple units of the type having a bi-metal junction located in a glass u-tube to project from a body of ceramic material, comprising a mould for a thermocouple unit formed in at least two mould members of mouldable material. These members include means for locating and holding at least some of the non-ceramic components of the thermocouple unit, in accurate spaced relation to each other prior to introduction of the ceramic material.

10 Claims, 3 Drawing Figures

THERMOCOUPLES

This invention relates to thermocouples and more particularly to a disposable thermocouple unit for use with a suitable lance holder or the like and associated instruments in the manufacture of steels and other metals.

Thermocouple units of this type are extensively used in industry to obtain temperature records of baths of molten metal particularly steel during reduction or alloying processes. A lance holder is used which incorporates electrically conducting contacts and leads so that the heat-generated electro-motive force in the thermocouple can be conducted to suitable recording units. A thermocouple unit is mounted on the end of the lance holder and after immersion in a bath of molten metal and a recording has been made of the temperature, the thermocouple unit is withdrawn from the bath and removed from the end of the manipulating lance holder. The type of unit with which this invention is concerned is primarily intended to be used once only then replaced with a new unit. However, it may be, and often is, used more than once.

There are many known thermocouple units of this type and furthermore a considerable number of these are variations of the particular type forming the basis of this invention.

In this type of thermocouple unit the bi-metal, or hot, junction is usually a platinum versus platinum/rhodium junction and is located in a quartz glass u-tube at the central part opposite the two ends thereof. The two thermocouple wires project from the two open ends of the u-tube.

Both open ends are embedded in a mass of suitable ceramic material such that the central part of the u-tube containing the hot junction projects from the front end of the unit. This ceramic material acts inter alia as a heat shield for the wires and any intermediate junctions of the thermocouple wires. The distance between the surface of the ceramic material and the projecting end of the u-tube (and hence the hot junction) is hereafter termed the "air gap" of the thermocouple unit. Consistency in the size of the air gap is an acknowledged essential requirement in the construction of this type of unit as seemingly small variations can result in relatively large variations in temperature recordings obtained from the thermocouples in use. Close control of the extent to which the ceramics material penetrates the open ends of the u-tubes is an important aspect in achieving the required consistency. In many instances the ceramic material is at least partly moulded in plastics material components thus defining an outer sheath for the unit.

Lack of consistency and accuracy in the results obtained from the thermocouple units can often be traced to imprecise manufacture. This results in, for example, variation in the air gap, cavities in the ceramics material and undesirable work-hardening of the thermocouple wires with insufficient subsequent annealing.

Opposite the u-tube and also embedded in the ceramics there is generally a member of electrically non-conducting material locating the two thermocouple wires or extension leads joined to them. This enables the thermocouple to be automatically electrically connected when the unit is fixed to the end of the manipulating lance holder. The member is generally in the form of a short plastics socket into which is inserted a corresponding electrically conducting probe carried by the lance holder.

One manufacturing procedure entails manually locating the u-tube, previously threaded with the hot junction, in the correct position in the top of a plastics component. This latter component may conveniently be positioned in a suitable jig. The intermediate junctions of the thermocouple wires and the extension leads are located within the component with the socket member referred to above projecting from the rear thereof and locating the extension leads. The component is then filled with ceramics material which is allowed to partially set before being removed from the jig. Use of the plastics material components does not readily permit employment of annealing techniques after the ceramics material has set.

In other manufacturing techniques metal or the like moulds are used to mould the ceramics material. However, this procedure has been found generally unsatisfactorily and difficulties have been encountered in the provision of resilient portions in the dies to protect the u-tube. A high rate of production necessitates the rapid removal of the partially set units from the dies with a consequently high post-moulding loss rate. Furthermore, the moulds must often be coated with a suitable release agent prior to moulding. This is not only a time consuming procedure but release agents used to date have not effectively stopped a high proportion of wastage being caused by the ceramic material sticking to the moulds.

An object of this invention is thus to provide an improved method and apparatus for manufacturing thermocouple units of the type broadly described above.

According to one aspect of the invention a mould for use in manufacturing thermocouple units having a hot junction located in a glass u-tube to project from a body of ceramic material comprises a mould for a thermocouple unit formed in at least two mould members of mouldable material, the members including means for locating and holding the non-ceramic components of the thermocouple in accurate spaced relation to each other prior to introduction of the ceramic material.

Further according to the invention the material is elastically deformable plastics material and the plastics material is impermeable foamed or expanded plastics material and is preferably expanded polystyrene; and the mould members include provision for introducing the ceramics materal into the mould cavity from that end of the mould cavity corresponding to the end of the thermocouple unit remote from the bi-metal junction thereof.

Still further according to the invention there are two mould members which are preferably symmetrical; the two mould members co-operate to form multiple adjacent and parallel mould cavities in parallel relationship; and preferably mould cavities are located in opposite faces of a block of suitable material to enable sets of moulds to be formed when the blocks are stacked together.

The invention also provides that the mould forms the packaging material for transport of thermocouple units or the non-ceramic components thereof and may be disposable.

Accordingly a second aspect of the invention is a method of manufacturing thermocouple units comprises the steps of locating in spaced relationship the non-ceramic parts of each thermocouple unit in one of at least two co-operable mould members as defined above;

closing the mould; introducing liquid ceramics material into mould cavities formed by the co-operating members and allowing the ceramics material to set.

Further features provide for the ceramic material to be introduced into the mould from a point remote from the glass tube and under sufficient pressure to control the level of ceramic material introduced into the open ends of the tube.

This invention provides further a method of manufacturing thermocouple units using a mould and moulding method as above defined wherein the non-ceramic components are introduced in the mould and the latter closed and dispatched for the introduction of ceramic material at another location.

A preferred embodiment of the invention, described by way of example only, follows with reference to the accompanying drawings in which.

Figure 2:
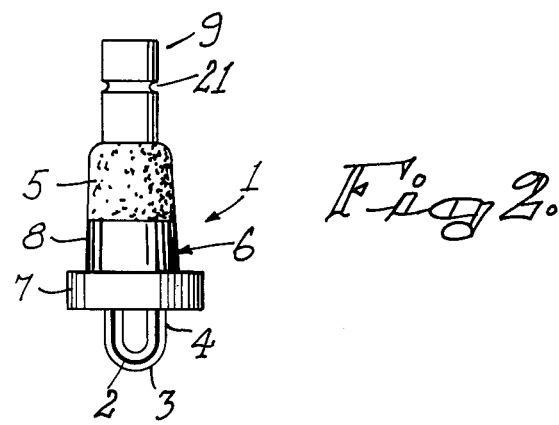
FIG. 2 is a side elevation of a thermocouple unit.

In this embodiment of the invention a mould is provided for use in manufacturing a disposable thermocouple unit 1 as indicated in FIG. 2. The unit consists of a bi-metal junction 2, for example a platinum versus platinum/rhodium junction centrally located in the bend 3 of a glass u-tube 4. Both ends of the u-tube are embedded in a mass of ceramic material 5. In the regions adjacent to the u-tube the ceramic material is partially enclosed by a thin-walled plastics collar 6 which has a flanged portion 7 and a projecting smaller diameter short frusto-conical portion 8. The collar 6 is open at both ends allowing the ceramic material in the collar to project from the short portion 8 in an extended frusto-conical configuration.

Projecting co-axially from the end of the exposed section of ceramics is a hard plastics tube 9 which has one end embedded in the ceramics. The inside of the end portion 10 of the tube carries the free ends of a pair of extension leads 11, the other ends of the leads being connected to the ends of the platinum and platinum/rhodium wires respectively to form the intermediate junctions. These latter connections are preferably located within the ceramic mass 5 and furthermore the extension leads may take the form of compensating leads if this is required.

In use the thermocouple unit is adapted to have a cylindrical cardboard tube fixed to extend co-axially from behind the flange portion 7 of the collar 6. This tube then fits over the end of a suitable lance holder or probe with the plastics tube 10 forming a suitable socket for the lance holder such that the thermocouple is electrically connected to its associated apparatus.

Figure 3:
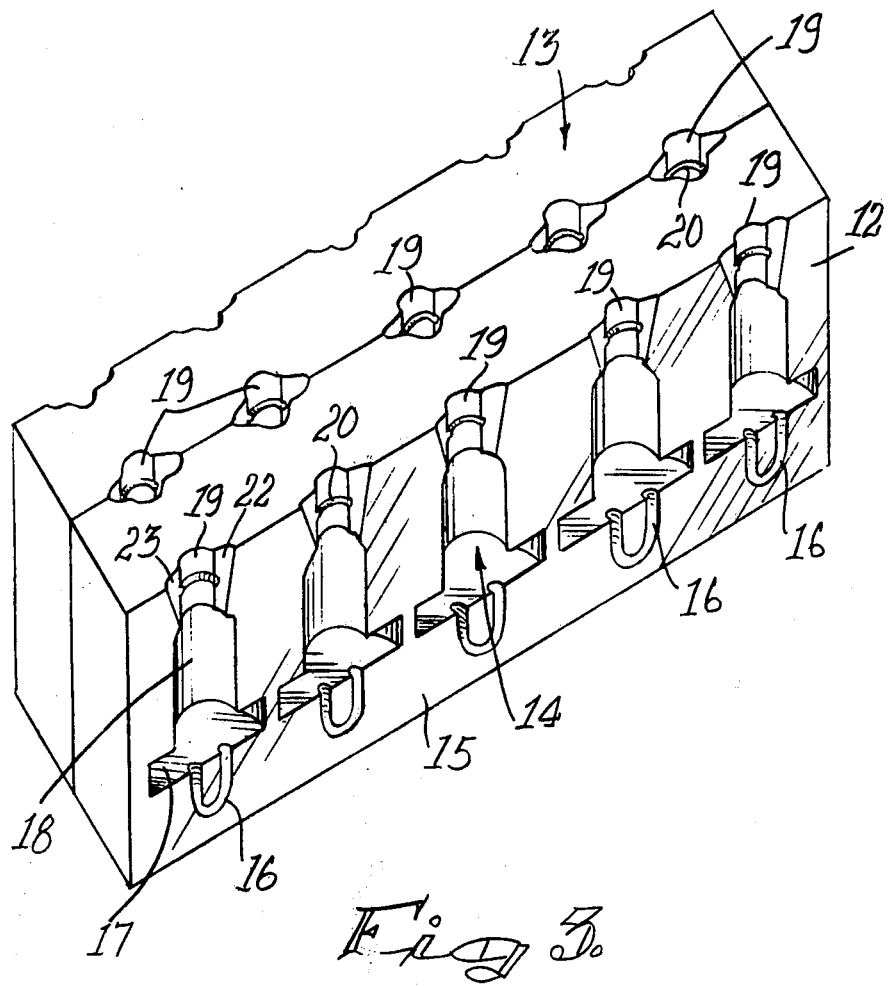
FIG. 3 is a view of a closed mould.

The mould for manufacturing the units is made from foamed polystyrene and takes the form of a pair of similar, symmetrical mould cavities 14 formed in the faces of two rectangular blocks 13 of this material. In each block 13 there is a plurality (for example five) of adjacent and parallel mould cavities 14 as shown in FIG. 3. Each foamed polystyrene block 13 has five (or any other suitable number) mould cavities 14 in each of its two opposite faces 12. Furthermore, the mould cavities in one face are mirror images of the mould cavities in the other face. This arrangement enables the number of polystyrene blocks to be decreased significantly for a given number of moulds by stacking the blocks together.

Each mould cavity conforms to the configuration of the thermocouple unit as outlined above and depicted in FIG. 2. Thus there is a portion 16 for locating the glass u-tube, a portion 17 for locating the flange 7 of the collar 6, a portion 18 for forming the exposed truncated portion of the ceramics 5 and a neck portion 19 for locating the plastics tube 9. This neck portion 19 has a semi-circular projection 20 which co-operates with a circular indentation 21 in the tube 9 such that it is located to project a required amount from the mould as shown in the central mould cavity in which the non-ceramic parts of the thermocouple unit are depicted in position.

Adjacent to the neck portion 19 of each mould cavity 14 is a duct 22 for introduction of ceramic material and an open riser 23.

It is not necessary that there be only two mould members and in some applications more, for example three, may be preferable.

Figure 1:
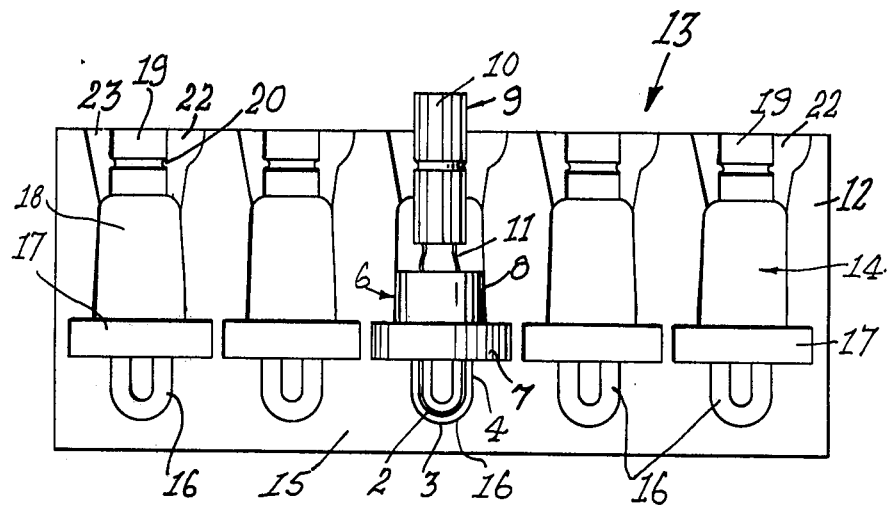
FIG. 1 is an elevation of a mould member including the non-ceramic components of a thermocouple unit in one of its mould cavities.

In use the non-ceramic parts of the thermocouple units are positioned in the mould cavities of one face of a block 12 as shown in the central mould cavity of FIG. 1. The two sets of mould cavities are brought together to close the mould and the parts mentioned are firmly held in position. If desired, additional sets of moulds may be closed by stacking the polystyrene blocks against each other as described above.

At this stage the moulds 14 are ready for the introduction of the ceramic material which may take place immediately or after storage or transport or both of the closed moulds. This enables the ceramic material to be moulded to complete the units at locations remote from where the non-ceramic components are assembled while the accurate location of these components is maintained. The ceramic material is introduced via duct 22 when the mould cavities 14 have their axes in a vertical orientation. The liquid ceramics flows to the bottom of the mould cavity and rises until it emerges from the open riser 23. By extending the height of the duct 22 and open riser 23 a pressure is provided in the mould to cause a small but certain amount of ceramics to be forced into the open ends of the u-tube. Because the moulds are disposable the ceramic is allowed to set and the completed units stored, in their moulds for any length of time without effecting the rate of production of the units. Improved and more rapid introduction of the ceramic material may be achieved by first evacuating the moulds.

As alternatives to the above embodiment the plastics section of the unit may be entirely omitted with the whole unit, other than the u-tube bi-metal junction and leads, made from ceramics, or the entire ceramics portion of the unit may be encased in plastics. In the latter instance only that end of the single plastics section adjacent the u-tube need be located in the mould which may be correspondingly decreased in size.

Experiments have shown that expanded polystyrene constitutes an exceptionally good material for forming moulds for ceramic materials as the latter do not stick thereto and thus no release agents are required.

Moulding thermocouple units in this way has a number of advantages including the following:

Consistency in the size of the air gap is easily obtained as in each case the position of the u-tube and the ceramic material is defined by the mould. In this way the quality of the units is maintained no matter where or when the ceramic material is introduced into the mould.

As mentioned previously, the plastics part of the units may be omitted from the moulding procedure and the resulting units may be heated to anneal the metallic components which may have work-hardened during fabrication. In such an instance the hot junction in the quartz glass is located in a suitable expanded polystyrene mould and the flanged portion only in which the tube ends are embedded is cast in ceramics. After this stage the partially cast unit is removed from the mould and heated to a sufficient temperature to anneal the metallic components. Thereafter the partial unit is located in a full mould as described above together with the plastic tube 9 and the remainder of the ceramics material is cast. In this way the moulding is carried out in two stages. Obviously more stages may be provided if necessary.

By moulding in the orientation described the denser material is located in the area adjacent the u-tube if any air bubbles are trapped during introduction of the ceramics. Furthermore, some ceramics may be forced into the ends of the u-tube by providing suitable risers to the mould. This ensures that a good seal is obtained around the ends of the u-tube.

Apart from the advantages of moulding in general, the use of expanded polystyrene moulds as provided by this invention provides several advantages other than those mentioned above relating to its non-adhesive nature with respect to ceramics.

In the first place, the moulds are inexpensive. Thus, they may be used as storage containers for the units and may be thrown away when empty. As the units may be kept in their moulds for reasonably long periods and as polystyrene is impermeable to water, the moisture in the ceramics is retained during the curing process with the result that the strength characteristics of the ceramic material is improved.

The mouldable or elastically deformable nature of the expanded polystyrene ensures a good seal around the glass u-tube during the moulding process and also decreases the number of u-tube breakages and consequently useless thermocouples.

As mentioned before, the non-ceramic parts of the units are immovably located in the moulds and thus there is no necessity for immediate introduction of the ceramics. The incomplete units may thus be transported and exported from one country to another prior to the introduction of the ceramic material thus reducing transport costs. Furthermore, skilled or intensive labour is not required for the maintenance of quality control and in the case of exportation a local material and labour content is introduced into the final unit.

Other embodiments are envisaged within the scope of the invention, particularly with respect to the configuration of the thermocouple unit.

What I claim as new and desire to secure by Letters Patent is:

1. A method of manufacturing thermocouple units, which units include a body of ceramic material, a glass u-tube whose end portions are embedded in the ceramic and whose remaining portion projects beyond the front face of the ceramic, and a bi-metal junction located within the u-tube, said method comprising:
   providing at least two matable mould members having internal recesses which when mated form a mould cavity conforming to the outer configuration desired for the thermocouple including particularly the projecting u-tube portion and the face of the ceramic from which it projects,
   installing the u-tube in at least one mould member with the projecting portion in its conformed mould part,
   mating the matable mould members to form the cavity,
   orienting the mould cavity so that the front face conforming portion of the cavity is at the bottom of the cavity, and
   introducing settable ceramic material into the cavity in such manner that the ceramic reaches the front face-conforming portion of the cavity from a direction opposite to the projecting u-tube portion so that the ceramic body is densest adjacent its front face.

2. The method of claim 1 further comprising
   also installing in the mould other non-ceramic components of the thermocouple unit prior to mating.

3. The method of claim 2 further comprising
   introducing the ceramic material in liquid form into the mated mould.

4. The method of claim 3 further comprising
   utilizing the mated mould for storage or transportation of the components installed in the mould prior to introducing the ceramic.

5. A method as claimed in claim 3 in which the ceramic material is introduced into the mould from a point remote from the glass tube.

6. A method as claimed in claim 5 in which the ceramic material is introduced under sufficient pressure to introduce ceramic material into the open ends of the tube to a controlled level.

7. The method of claim 1 further comprising
   introducing into the mould liquid ceramic in quantity sufficient to embed the end portions of the u-tube but not sufficient to form the entire ceramic body,
   removing the resulting ceramic and end-embedded u-tube from the mould,
   annealing the bi-metal junction,
   reinstalling the resulting ceramic and end-embedded u-tube and annealed junction in a mould similar to the first-mentioned mould, and
   introducing sufficient additional liquid ceramic to complete the therocouple unit.

8. A method as claimed in claim 7 in which the first and second-mentioned moulds are the same.

9. The method of claim 7 wherein
   no plastic components of the to-be-completed thermocouple unit are installed in the mould during the first-mentioned introducing of ceramic.

10. The method of claim 9 wherein
    any plastic components of the to-be-completed thermocouple unit are installed in the mould prior to the second-mentioned introducing of ceramic.

* * * * *